United States Patent
Carrasco Martinez

(10) Patent No.: US 6,628,425 B1
(45) Date of Patent: Sep. 30, 2003

(54) METHOD FOR APPLICATION OF COLORS AND TONALITIES TO VARIOUS SURFACES

(76) Inventor: Vincente Carrasco Martinez, Poeta Zorrilla 19, Paterna (ES), E-46980

( * ) Notice: Subject to any disclaimer, the term of this patent is extended or adjusted under 35 U.S.C. 154(b) by 0 days.

(21) Appl. No.: 09/355,647

(22) PCT Filed: Feb. 4, 1998

(86) PCT No.: PCT/ES98/00023
§ 371 (c)(1),
(2), (4) Date: Aug. 2, 1999

(87) PCT Pub. No.: WO98/34793
PCT Pub. Date: Aug. 13, 1998

(30) Foreign Application Priority Data

Feb. 5, 1997 (ES) ............................................. 9700231

(51) Int. Cl.7 ............................................. G06K 15/00
(52) U.S. Cl. ...................................... 358/1.9; 358/3.12
(58) Field of Search ...................... 355/1.9, 1.2, 1.7, 355/3.09, 3.11, 3.12

(56) References Cited

U.S. PATENT DOCUMENTS 6,088,122 A * 7/2000 Coleman .................... 358/1.9
6,346,959 B1 * 2/2002 Uchiyama .................... 347/172

FOREIGN PATENT DOCUMENTS

| EP | 0011722 | 6/1980 | ............. B41J/3/04 |
| EP | 0321315 | 6/1989 | ............. H04N/1/40 |
| EP | 0741042 | 11/1996 | ............. B41J/2/21 |

* cited by examiner

Primary Examiner—Jerome Grant, II
(74) Attorney, Agent, or Firm—Richard M. Goldberg

(57) ABSTRACT

The invention relates to a method for applying colors by subdividing the colors according to percentages allocated to each of the printing points which are, for example, divided centesimally in accordance with a rule which defines the distribution of appropriately superimposed basic colors, thereby creating binaries and blacks according to the subtraction of the percentage of the basic color most used percentually from the sum of basic colors less used percentually. Thus, the totality of visible colors are optically generated. The background of the surface to be printed is previously analyzed and the percentage quantity in each point of the based colors is deducted in the proportion contained in the background. The application of pigments is carried out by addition of transparent substrate or medium or while, until the proportion of each color is completed.

8 Claims, 8 Drawing Sheets

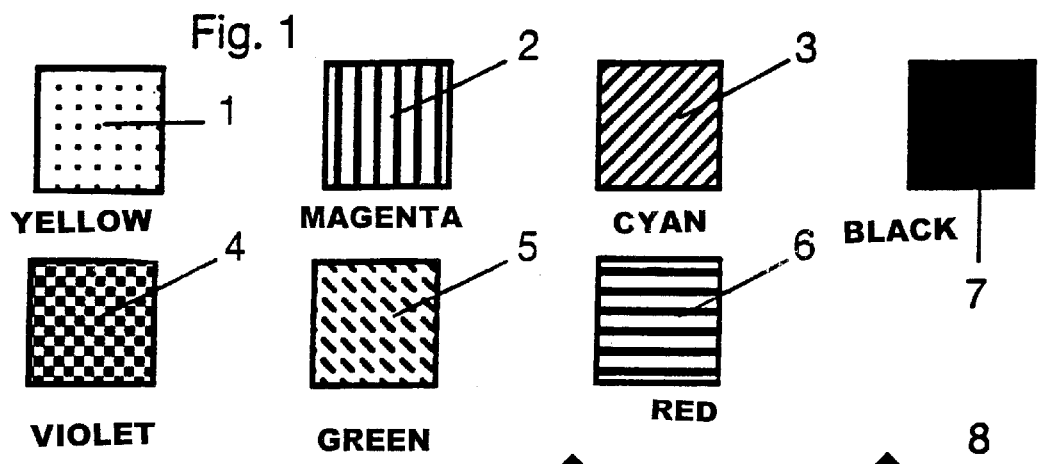
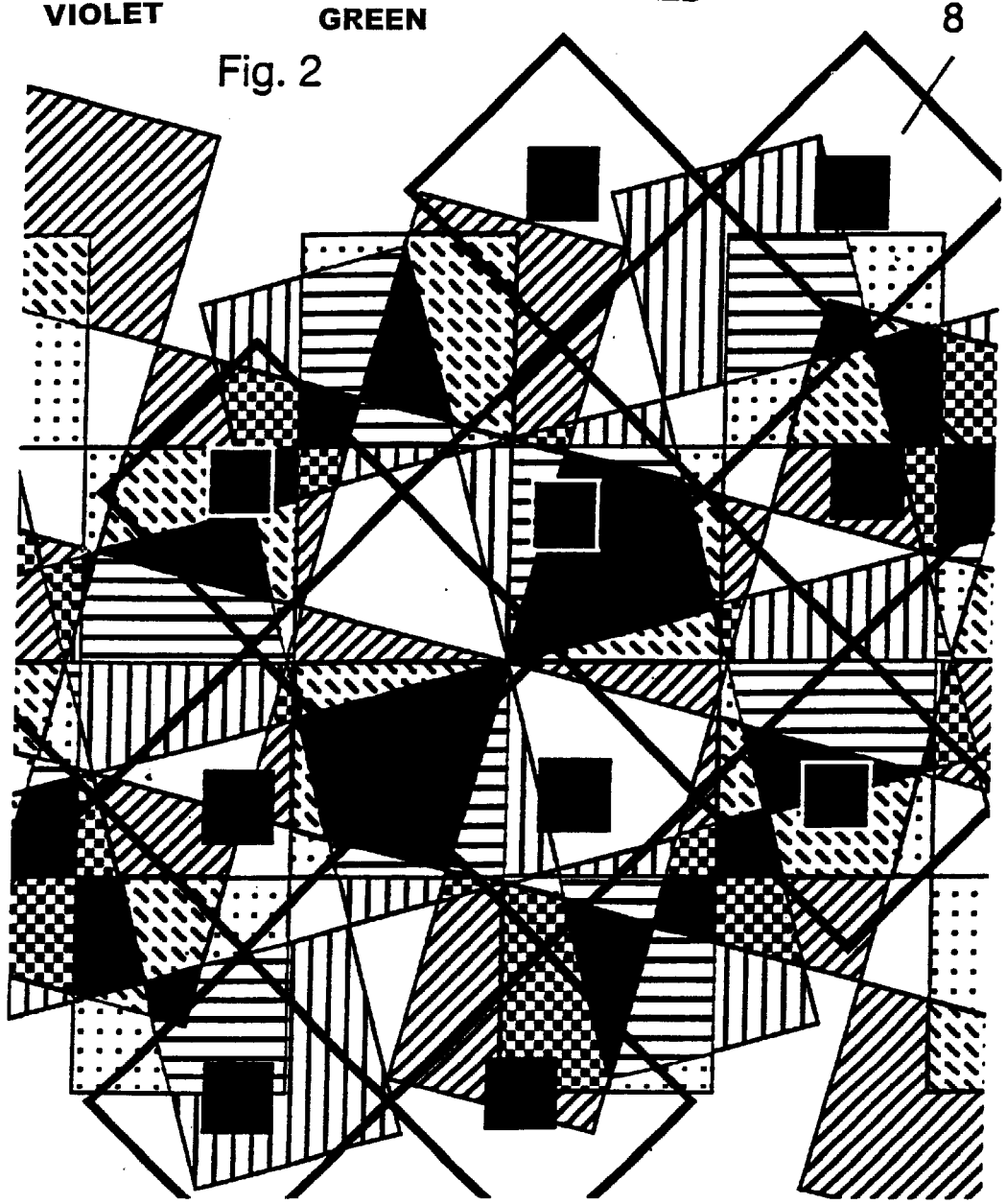

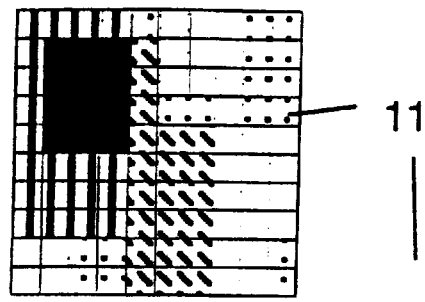
Fig. 5
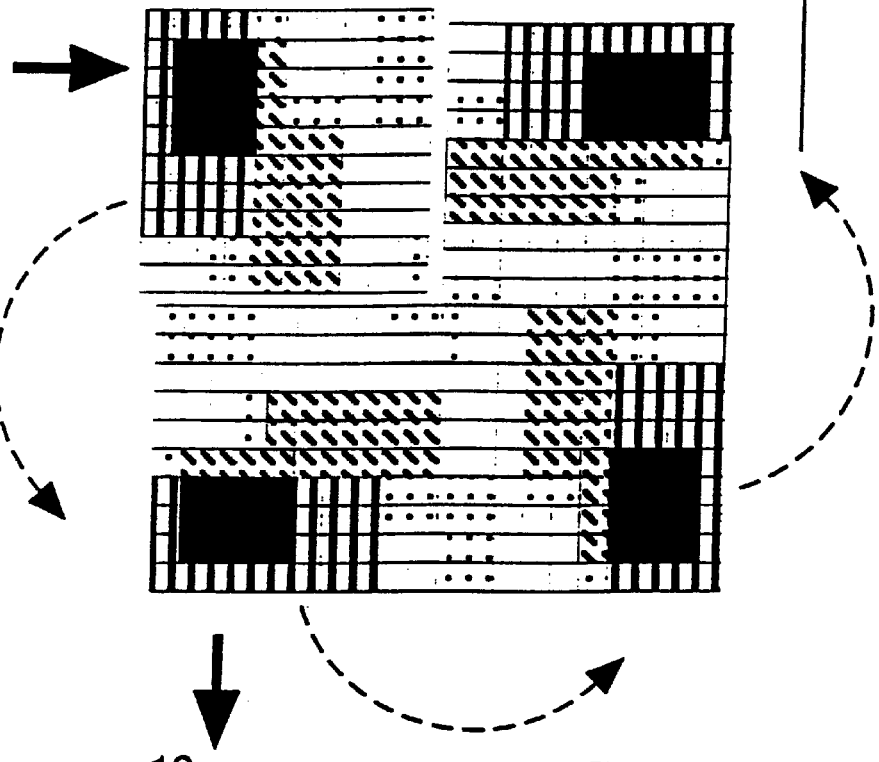
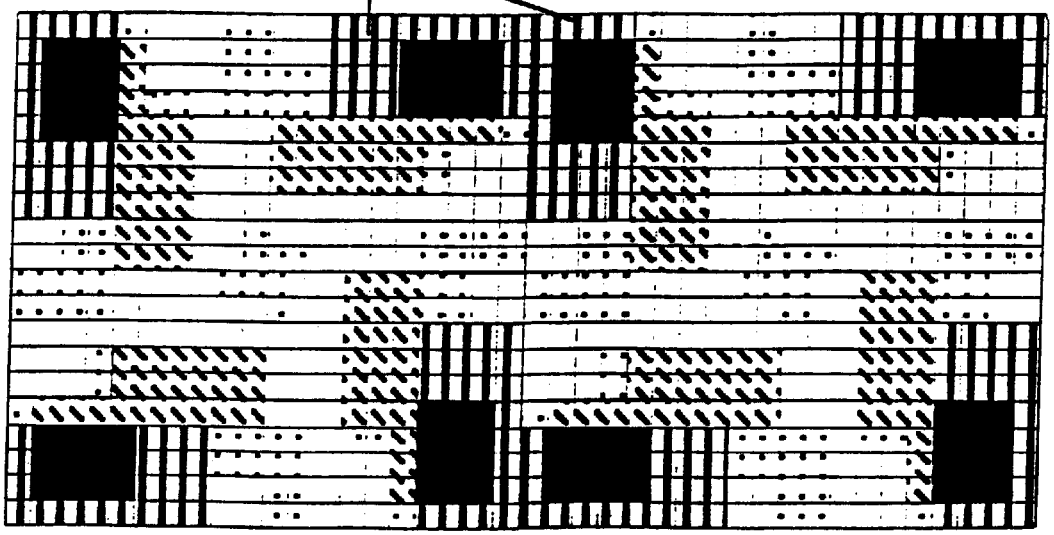
Fig. 6

Fig. 10
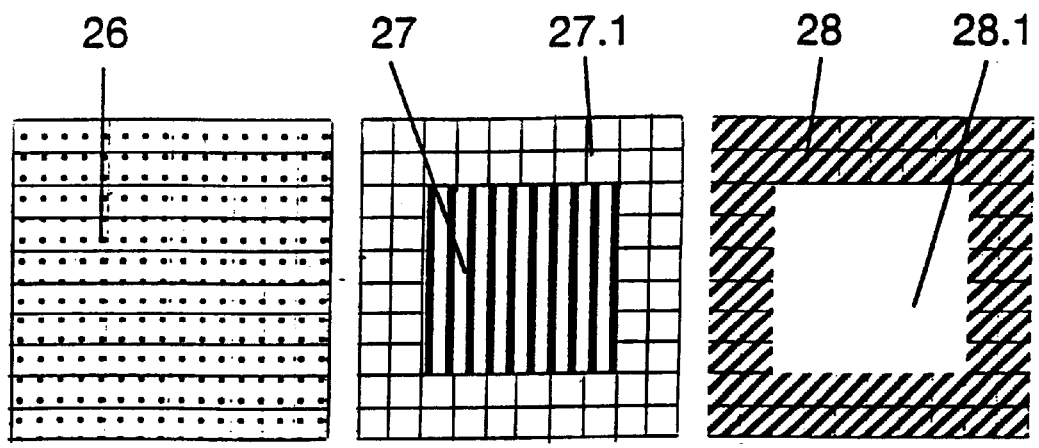
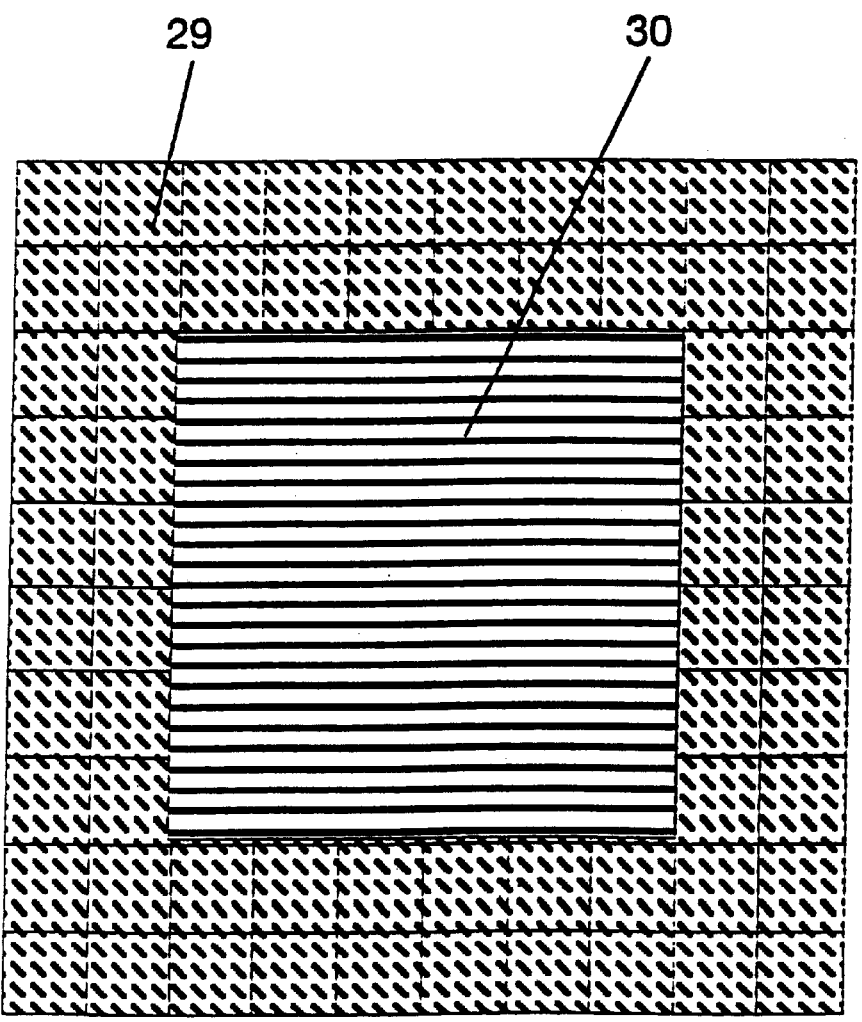

Fig. 11
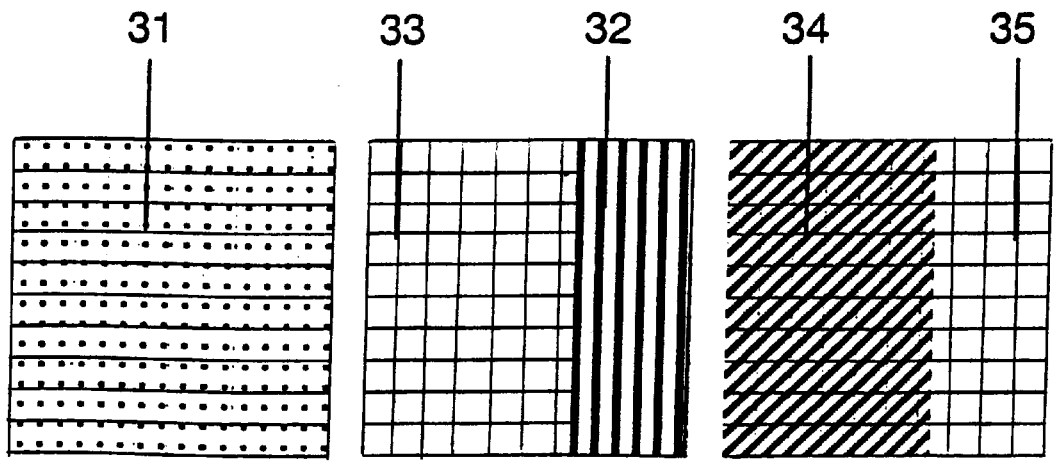
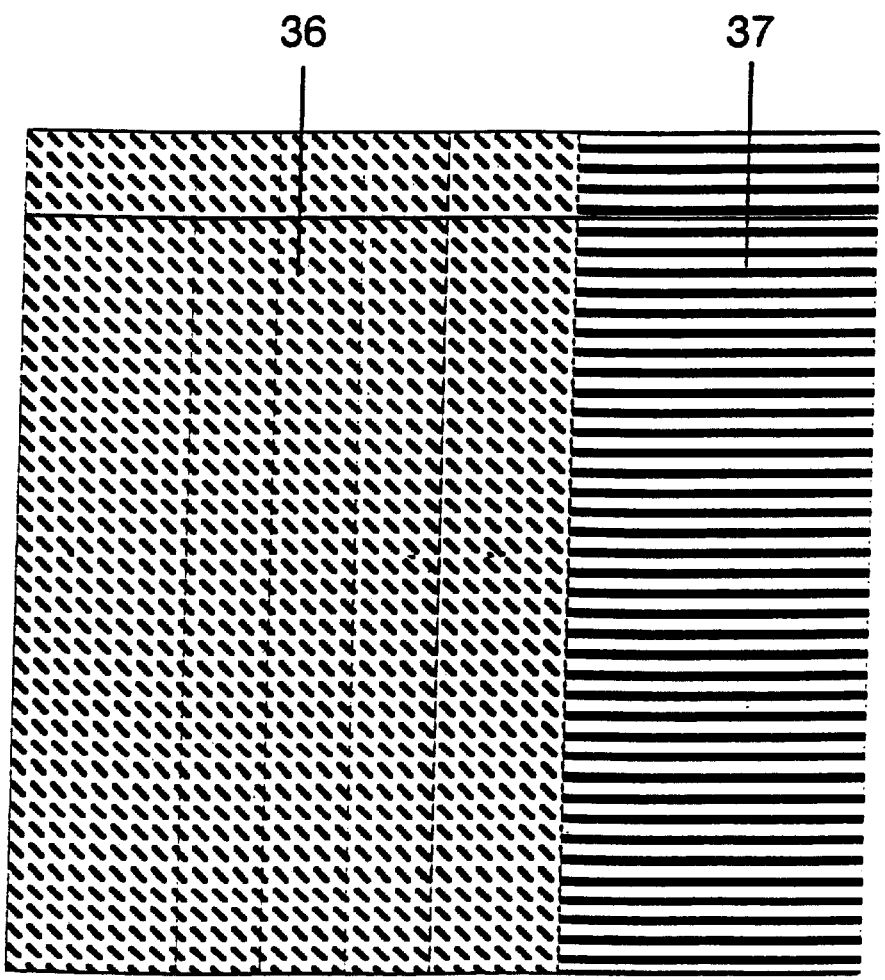

METHOD FOR APPLICATION OF COLORS AND TONALITIES TO VARIOUS SURFACES

BACKGROUND OF THE INVENTION

The sector covered by this patent's technique is the graphic arts and computer technology sphere, particularly in the application of colours and tonalities and in decoration.

Statement of the prior state of the art. The techniques previously known for printing with the machines available on the market generate the plates of the three basic colours and black for example, so that the basic colours and black are printed in successive impressions by the conventionally driven rotation of the screen, so that the screens thus arranged generate—when the sum of their colours exceeds 50% of the surface area—erroneous combinations and therefore contamination of the intended colour, removing light through the invasion of the white, and with a consequent lack of accuracy in the resulting colour. This lack of light and colour contamination requires a successive correction process, in which the different combinations of colours have to be tried out without over obtaining the tonalities intended. For this reason the colour turns out to be unreal in large areas of the image, and what is more inconvenient still, it is impossible to repair by known methods on this kind of screen. Another undesired effect caused by the rotation of the screens is the appearance of what is known as the "moire" pattern, through improper positioning of the screens.

Another well-known technique is the stochastic method, which consists in the arrangement of a great density of dots of a very small size, distributed to form the image, the more dots the darker this has to be. This technique obtains good results, and has the disadvantage that the dot is fixed and photolithographs cannot be touched up, and the machines and paper have to be special.

EP-A-0 321 315 consists of an apparatus for printing half tone image reproductions, which make a selection of the printing based on the intensity of the pixel to be printed and according to a pseudo-random number, which result in print or unprint of the said pixel.

There is not a definition of how to compose the colour and this system is not useful for conventional printing methods.

EP-A-0 011 722 refers to a method and device for making colour reproductions which consists of a method of obtaining a scanned image and its being said image printed by ink injection. The method allow to correct the printing units.

This method does not allow to analyze and describe the colour in an elemental area in such a way that the colour could be cleanly printed, and also does not allow to be used in conventional printing means.

EP-A-0 741 042 refers to a control of liquid-ink printing and discloses a method for avoiding redundant printing and reducing the discontinuity between pixels, substituting or modifiing the relation or proportion of ink dot prints, which shows frequently a discontinuity between pixels, and some of the pixels are frequently dotted.

This control and printing system does not give any rule for the positions or composition to the colour set in each pixel, and does not solve the obtention of a natural colour when printed in pixels, and also, as the previous documents, is not useful for conventional print systems.

SUMMARY OF THE INVENTION

The present invention consists of the arrangement of colour in each dot so that this is structured by subdivisions of the initial layout of the aforementioned dot, and the basic colours are laid out on surface in this way. It aims to provide a method for polychrome printing on diverse surfaces which provides absolute uniformity as regards the distribution of the masses of colour, avoiding the "moire" effect, generating the colour as this is found on the original photograph, providing a greater luminosity and also constituting an arrangement that can be printed with the same uniformity as many times as is necessary. The treatment of the colour pigment is also expressed according to a common rule.

In this text it should be understood that we mean screens, dots, lines or reticles, even when talking of dots, for reasons of dialectic simplification.

This method consists in treating the reticle for taking and picking up colour whenever this is present, to the corresponding size, by means of mixing through joining other dots or a combination of these, without producing contamination by printing from screens in rotated positions thus generating undesired combinations.

BRIEF DESCRIPTION OF THE DRAWINGS

In order to make the following explanation clearer, eight sheets of drawings are enclosed, containing twelve figures to represent the essence of this invention.

FIG. 1 shows a diagram of the colour codes.

FIG. 2 shows a basic four-colour print according to the rotation of the screens.

FIG. 5 shows a random layout of the arrangement of chromatism in one dot, and the arrangement of four adjacent points of this chromatism in each set.

FIG. 6 shows an arrangement through joining up each of the dots generated according to FIG. 5.

FIG. 10 shows a chromatic diagram of a dot in centred proportions of colour.

FIG. 11 shows a chromatic diagram of a dot in proportions of colour forming strips.

DETAILED DESCRIPTION

Figure 3:
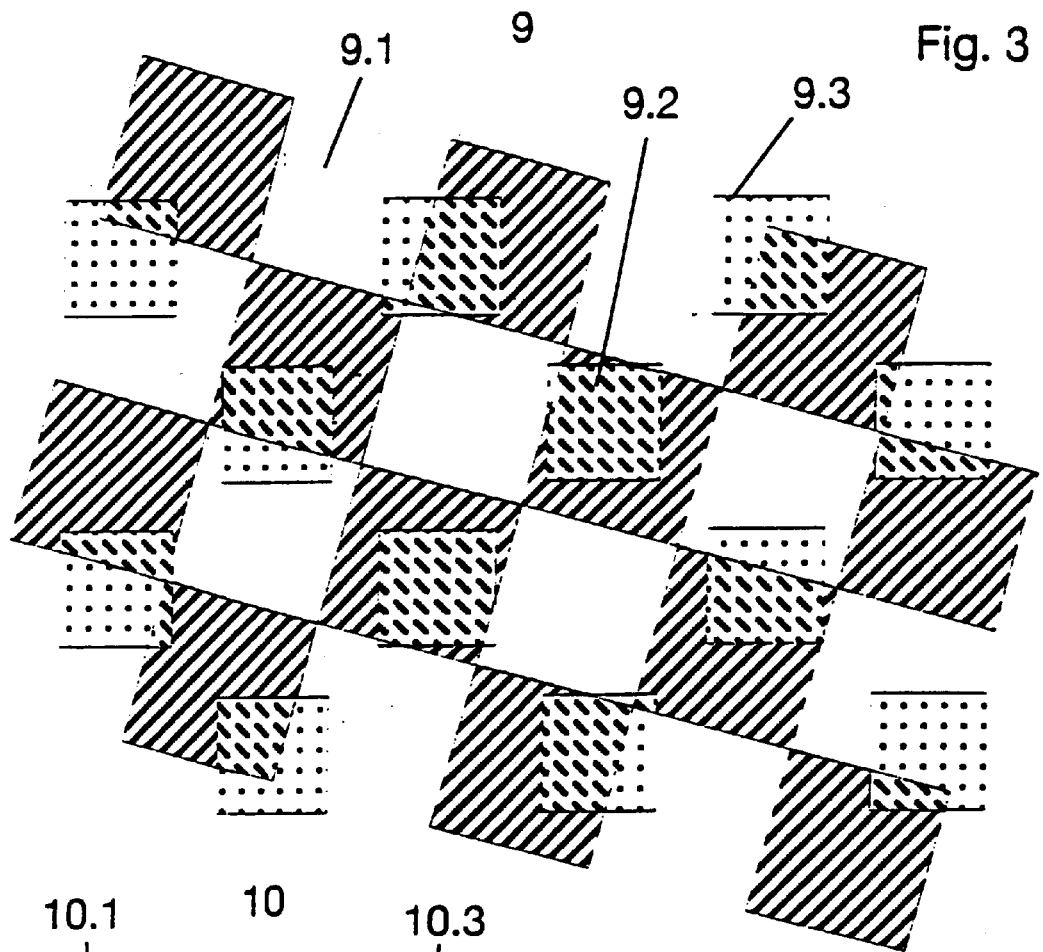
FIG. 3 shows a conventional basic two-colour print according to the screen rotation.
Figure 4:
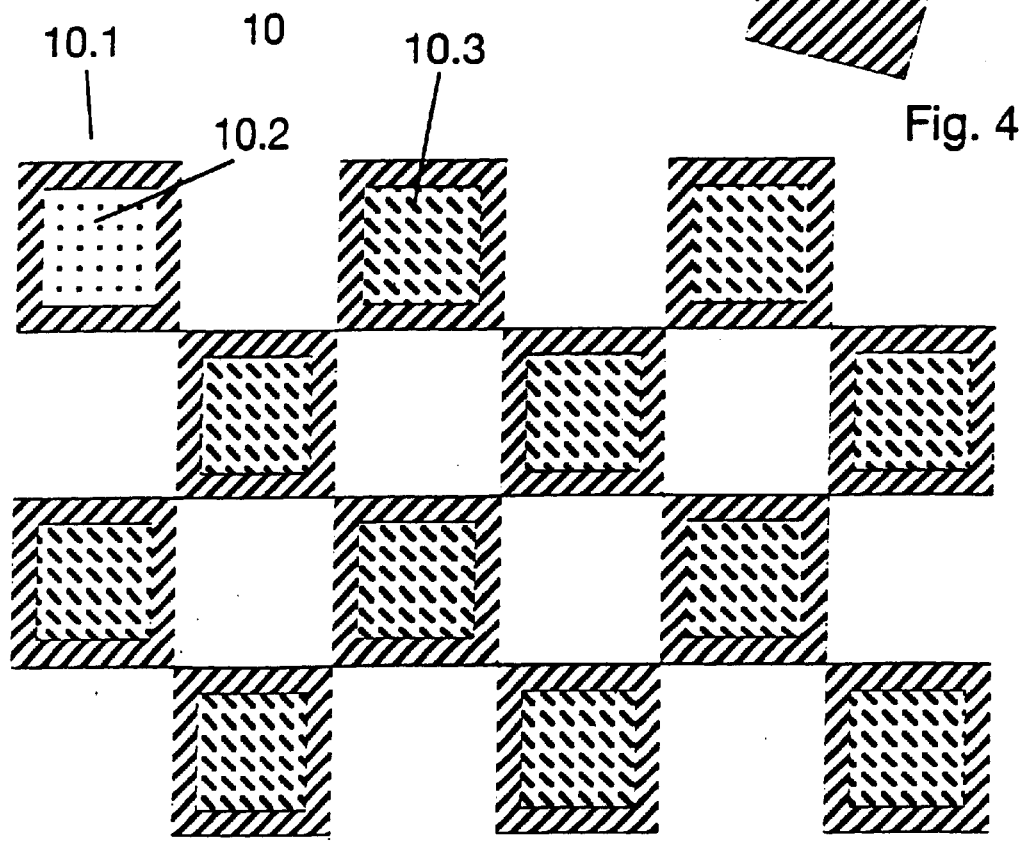
FIG. 4 shows a basic two-colour print through superimposing the corresponding chromatism in the centre of each dot.

In these FIG. 1 represents the code for the basic yellow colour, 2 the code for the basic magenta colour, 3 the code for the basic cyan colour, 4 the code for the resulting binary violet colour, 5 the code for the resulting binary green colour, 6 the code for the resulting binary red colour, 7 the code for the resulting tertiary black colour, 8 (FIG. 2) the result of the traditional application of rotating the screens, 9 (FIG. 3) a traditional application of turning the screens, 9.1 the resulting white space, 9.2 the uneven distribution of the yellow almost completely superimposed on the cyan, and scantily superimposed in 9.3, with this chromatic distribution being in the same proportion as is indicated by 10 (FIG. 4), carried out by the proposed method, in which 10.1 indicates cyan, 10.2 yellow and 10.3 the green resulting from these two. FIGS. 5 and 6 show treated arrangement of the dot according to a random form and layout with the possibility of using this to generate a personal and identifiable chromatic mass; 11 a dot of a particular colour, 12 the dot indicated as 11 set adjacent to a further three identical ones but turned 90° each, and 13 a uniform layout of colour resulting from the merging of a colour thus treated.

Figure 7:
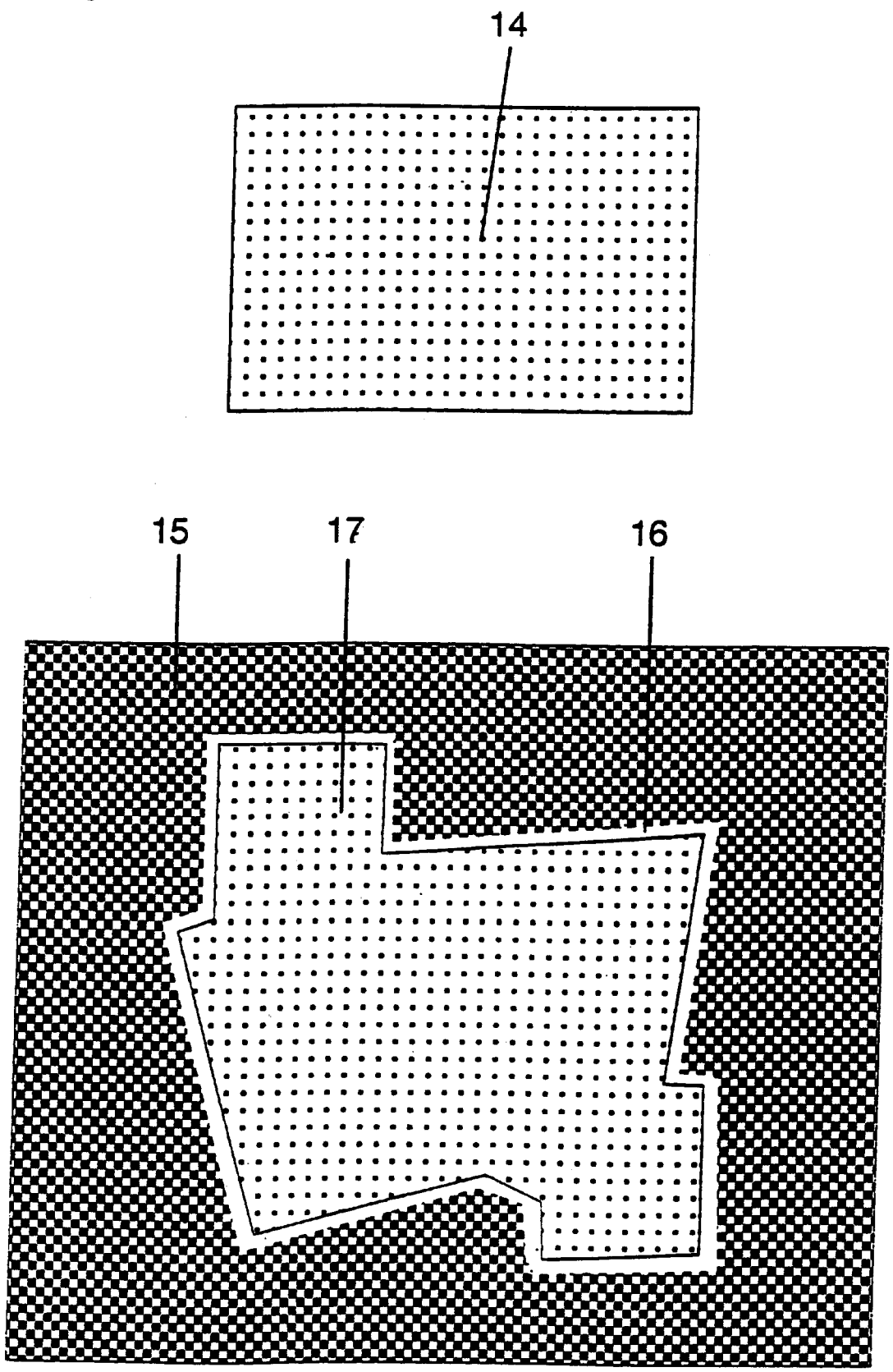
FIG. 7 shows an application of colour on a previously existing background.
Figure 8:
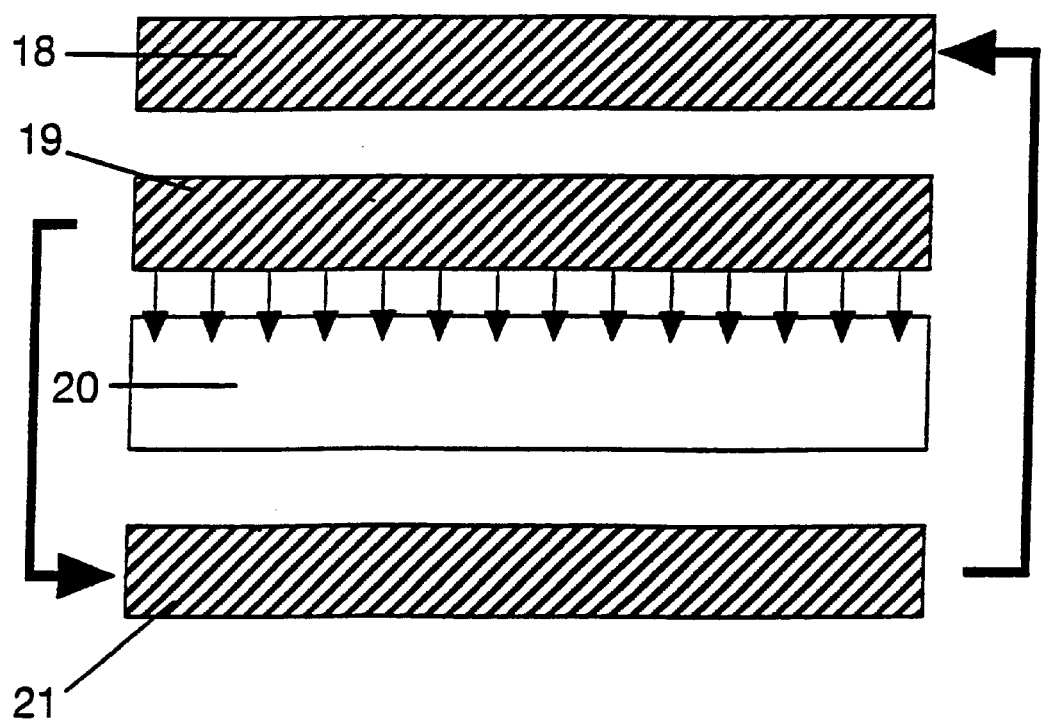
FIG. 8 shows the printing diagram of a colour on a white support.
Figure 9:
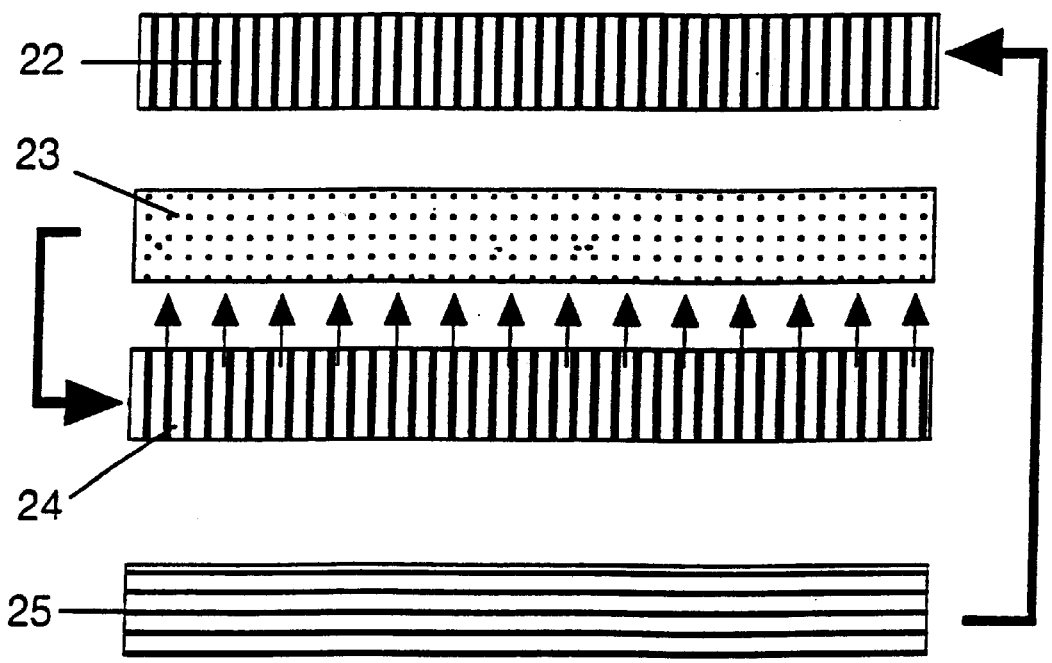
FIG. 9 shows the printing diagram of a colour on a yellow support, for example.

FIG. 7 shows a way of printing a colour on a previously existing background; 14 a yellow colour that has to be printed on a background, 15 a background of a violet colour on which yellow is going to be printed, 16 the prior impression in white, 17 the impression of yellow on the white; FIGS. 8 and 9 show the method of impression for obtaining an accurate result after analysis of the surface on which printing is to be made; 18 is the original colour of an intended impression; 19 the corresponding dye for obtaining said colour, for example cyan, 20 the support, which in this case is shown as white, 21 the result identical to the original, 22 the original colour of an intended impression, 23 the colour of the support, which in this case is yellow, 24 the application of a magenta colour to be combined with the colour of the support and 25 the result, identical to the original red.

Figure 12:
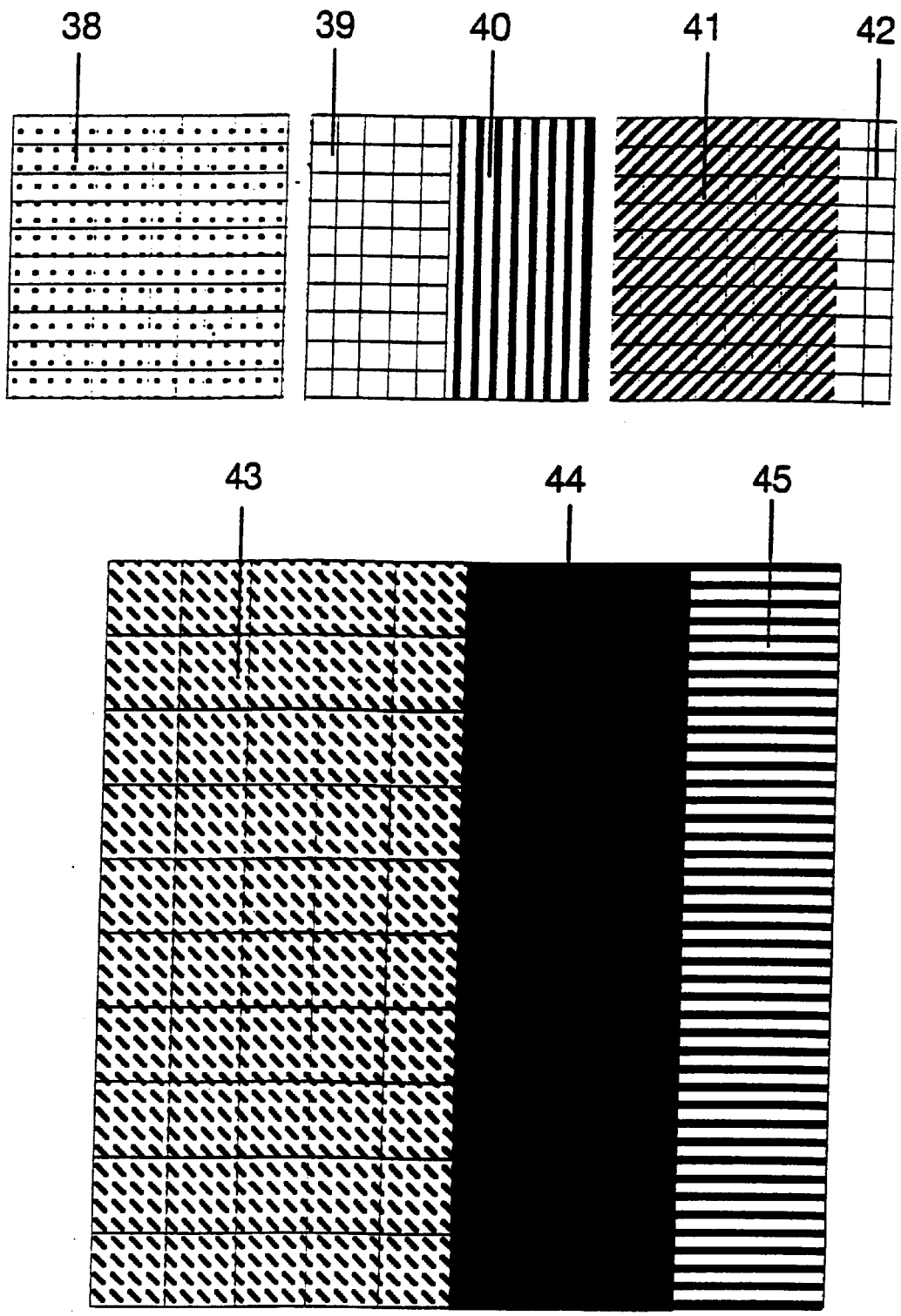
FIG. 12 shows a chromatic diagram of a dot in greater proportions of colour than in FIG. 11, forming strips.

FIGS. 10 to 12 show a treatment of the chromatism in the dot, and 26 therefore indicates the background yellow colour in a dot, 27 the magenta colour in this dot set out centrally, 27.1 showing the annular white space around the magenta, 28 the colour cyan on said dot laid out in an annular way in the dot, 28.1 showing the central white space in respect of the cyan; 29 shows the green result in the external ring of the dot, 30 shows the red result at the centre of the dot. Another example can be seen in FIG. 11, in which 31 indicates the yellow, 32 the magenta, 33 the remaining white in respect of the magenta, 34 the cyan, 35 the white corresponding to the cyan, and the result of this is indicated with 36 for the green, and 37 for the red, constituting a colour identical to that of FIG. 10 according to another arrangement. FIG. 12 shows colours in greater proportions, so that this looks black, and 38 indicates the yellow, 39 being the white beside the magenta 40, 41 the cyan, 42 the corresponding white, 43 the resulting green, 44 the resulting black and 45 the resulting red.

Explanation of a form of embodiment for the treatment of a photographic image.

The photolithographs have each of the colours in the dots of the screen, always in the same relative position. Each of the dots of the screen is subdivided into portions, and each of the colours, according to its proportion, occupies its space in the dot. For this reason, unlike the set of rotated screens, the colour obtained by means of the method herein is suitably uniform.

The arrangement of the colour in the dot can be carried out in several ways. The dot is so small that it is not at all necessary for the impression to be as stated, since the arrangement by parts of the dot is as valid as per strips in the dot.

Therefore, according to FIGS. 10, 11 and especially 12, the percentage represented by adding the proportion of the two colours least used over and above the percentage of the remaining colour determines the amount of black which is to appear, and in this figure there is a mixture of 100% yellow, 50% magenta and 80% cyan; the black part is determined by addition (50+80=130) and the subtraction of the remaining yellow (100). Said subtraction (130−100=30) constitutes the resulting black, that is 30% with any greater proportion being undesirable and the result of colour contamination. In this case of FIGS. 10 and 11, the percentage sum of the two colours least used comes to 100% (35+65=100) so that the difference with the other colour (100) gives a result of 0 (100−100=0) so that neither white nor black appears.

One possibility opened up by this method, which does not exist in any other, is the possibility of manipulating each one of the screens, so that the colour is modified in some of the dots which form this, so that effects are softened or hardened or said effects are produced in the intended way, unlike the one resulting from a photograph, for example. The development of this is therefore carried out by means of the arrangement of the development of the parts, strips, screen, lines of each dot, in a form which can be centered, random, arbitrary, or following preset codes.

Explanation of a form of embodiment for the treatment of a colour or tonality effect of a random image, for example drawings, logotypes, advertising identification, or others.

Random images are identified by colours or tonalities. This method enables identifying the colours, the tonalities and especially by the effects that can be generated by printing these. In this way, through being able to arrange the dots which configure the masses in a unique or personalised way, one can construct these structures of colour or tonality, advertising symbols or identifying signs or ones of particular products, which are treated in a personalised, and thus recognisable way.

The possibilities of forming a mass are therefore:

by rotating each dot 90° inwards or outwards.

adjacent arrangement (effects).

opposite arrangement hexagonal; pentagonal, square, triangular dot, etc.

fixed or isolated dot, centering this or arranging the irregularities or chromatic unevenness laterally can be touched up by hand by computer media, for modifying effects.

not absolutely white papers: these are treated so that the tones found in them are deducted and thus the colour of the base supports the resulting colour.

Explanation of one form of embodiment for digital treatment.

The conceptual content of digitally obtained colour is as has previously been stated and explained, and is formulated in the following way. As an example we shall take the aforementioned case 100–50–80. The black will thus be 130−100=30%. The expression of the colour could be according to the black and white indication method, or only of black. In the first case, the formulation could be stated as 100 050 080 030 000, corresponding to yellow, magenta, cyan resulting black or remaining white, respectively. Statement of the last number can be avoided through being information deducted from the previous ones. Printing can be done with digital machines by present laser technique on four or seven heads, with no limit to their number. On four heads it would therefore be yellow, magenta, cyan and black. On seven it would be yellow, magenta, cyan, black, violet, green and red.

Explanation of a form of embodiment for the treatment of pigment.

Pigment has a proportion of colour, a medium, that is, a colourless thinner or colourless substrate which dilute the others, varying the tonality, present or not present in each mixture and a proportion of white present or not present in each mixture completing the proportions. In pigment treatment, the medium dilutes the others. In the previous example, applied to pigment, this would be: 100% yellow, 50% magenta and 80% cyan. There is also a sufficient proportion of medium for obtaining the required colour and corresponding white according to the previously mentioned formula with a limit according to the colour, whether basic up to 100 parts, binary up to 200 parts and tertiary up to 300 parts. The expression of the colour pigment will be:

a) 100–050–080–070–000 corresponding to yellow, magenta, cyan, medium and white.

In this case 70 parts medium.

b) 100–050–080–000–070 corresponding to yellow, magenta, cyan, medium and white.

In this case 70 parts white.

c) 100–050–080–030–040 corresponding to yellow, magenta, cyan, medium and white.

In this case 30 parts medium and 40 parts white, up to completing the 300 parts of the tertiary colour.

A conversion table sets the relations of colour with pigment. The formulate are, by changing where appropriate, adaptable to the subtraction, addition and optical systems.

By means of the proposed method, the whole range of perceptible colours is optically generated.

To sum up it may be stated that the requested protection will involve a method for printing in polychromy on different surfaces, by the cliché being structured in points which form linear evenly distributed screens, lines or reticles, and each one of the points of the cliché being structured, for example, centesimally, forming rows and columns with ten subdivisions, or for example, hexadecimally, forming rows and columns with four subdivisions, with the exact percentage of basic colour being constituted in each of the dots, distributed in such a way that the colours yellow 1, magenta 2 and cyan 3 have their proportions added up according to a rule which determines the combination of these colours occupying a specific space on each dot common to these colours and black, with the remaining space in each dot being used for white or unprinted background. On supports 23, provided with chromatic qualities, the chromatic percentage of said background 23 of the colour 25 applied on the corresponding cliché is deducted after their colorimetric analysis. Each of the dots is in its unit subdivided into portions, with the chromatism being distributed from the centre 27, 28.1, 30 towards the outside. In this method, furthermore, each of the dots is split into portions, with said dot being subdivided into proportions consisting of chromatic strips 32, 34, 37, and in each of the dots the chromatism is defined by computer media forming even arrangements 11 or random ones 13, with the chromatic set being divided into portions, for example of four dots 13. Each of these dots is formed of a colour defined by an identifiable concrete structure, possibly random. The method also involves the rule for distribution of the colours yellow magenta and cyan, in each dot, consisting of the subtraction from the sum of the two colours least used in percentage terms of the third color most used as a percentage, the result being the percentage of black existing if the two least used colours add up to more than the most used one, the proportion of white being determined by the subtraction of the percentage of the most-used colour from the percentage available. Finally, the rule for distribution of pigment consists of the proportion of colours, yellow, magenta and cyan or/and a colourless thinner or medium, and/or white in the remaining proportion until completion of the percentage corresponding to the basic, binary or tertiary colour.

This method can be used in industrial applications in graphic arts and in the computerised reproduction of colour.

What is claimed is:

1. A method for the application of colors and tonalities on different surfaces, comprising the steps of:

structuring a printing in dots on a surface;

forming each dot by regularly distributed screens, lines or reticles; and printing each of the dots according to an exact percentage of base colors required to form a desired color or tonality to print, said step of printing including the steps of:

applying said base colors to the screens, lines or reticles which form each dot, applying the basic colors in each given dot according to the following rule:

forming a black color on the screens, lines or reticles where three basic colors coincide, and forming white or a blank on the screen, lines or reticles where there is no basic color present, and wherein, when the colors have to be printed on a support having chromatic qualities, further including the steps of:

performing a colorimetric analysis, and subtracting a chromatic percentage of each base color present on said support from the color to be printed on said support.

2. A method for the application of colors and tonalities on different surfaces, comprising the steps of:

structuring a printing in dots on a surface;

forming each dot by regularly distributed screens, lines or reticles;

printing each of the dots according to an exact percentage of base colors required to form a desired color or tonality to print, said step of printing including the steps of:

applying said base colors to the screens, lines or reticles which form each dot, applying the basic colors in each given dot according to the following rule:

forming a black color on the screens, lines or reticles where three basic colors coincide, and forming white or a blank on the screen, lines or reticles where there is no basic color present, and wherein, with each of the dots being subdivided into portions, distributing said colors from a center towards an outside of the dot.

3. A method for the application of colors and tonalities on different surfaces, comprising the steps of:

structuring a printing in dots on a surface;

forming each dot by regularly distributed screens, lines or reticles;

dividing a chromatic set of dots into portions of a plurality of dots, forming each of said dots of a color defined by one of:

an identifiable fixed structure, and a random structure; and printing each of the dots according to an exact percentage of base colors required to form a desired color or tonality to print, said step of printing including the steps of:

applying said base colors to the screens, lines or reticles which form each dot, and applying the basic colors in each given dot according to the following rule:

forming a black color on the screens, lines or reticles where three basic colors coincide, and forming white or a blank on the screen, lines or reticles where there is no basic color present.

4. A method according to claim 3, wherein said chromatic set of dots is divided into portions of four dots.

5. A method for the application of colors and tonalities on different surfaces, comprising the steps of:
   structures a printing in dots on a surface;
   forming each dot by regularly distributed screens, lines or reticles; and
   printing each of the dots according to an exact percentage of base colors required to form a desired color or tonality to print, said step of printing including the steps of:
      applying said base colors to the screens, lines or reticles which form each dot,
      applying the basic colors in each given dot according to the following rule:
         forming a black color on the screens, lines or reticles where three basic colors coincide, and
         forming white or a blank on the screen, lines or reticles where there is no basic present, and
      distributing colors yellow, magenta and cyan in each dot according to a rule for distribution, said rule including the steps of:
         subtracting a first color most used as a percentage, from a sum of second and third colors least used in percentage terms, to produce a result being a percentage of black existing if the second and third least used colors add up to more than the first color most used, and
         subtracting the most used percentage of color from an available percentage to determine a proportion of white.

6. A method for the application of colors and tonalities on different surfaces, comprising the steps of:
   structures a printing in dots on a surface;
   forming each dot by regularly distributed screens, lines or reticles; and
   printing each of the dots according to an exact percentage of base colors required to form a desired color or tonality to print, said step of printing including the steps of:
      applying said base colors to the screens, lines or reticles which form each dot,
      applying the basic colors in each given dot according to the following rule:
         forming a black color on the screens, lines or reticles where three basic colors coincide, and
         forming white or a blank on the screen, lines or reticles where there is no basic color present, and
      applying a distribution rule for pigments, comprising the step of setting a proportion of at least one of the following:
         colors yellow, magenta and cyan, a colorless thinner or medium, and white
   in the remaining space of each dot, up to completing a percentage corresponding to a desired basic, binary or tertiary color.

7. A method for the application of colours and tonalities on different surfaces, comprising the steps of:
   structuring a printing in dots on a surface,
   forming each dot by regularly distributed screens, lines or reticles,
   printing each of the dots according to an exact percentage of base colors required to form a desired color or tonality to print, said step of printing including the steps of:
      applying said base colors to the screens, lines or reticles which form each of dot, and
      applying the basic colors in each given dot according to the following rule:
         forming a black color on the screens, lines or reticles where three basic colors coincide, and
      forming white or a blank on the screen, lines or reticles where there is no basic color present,
   defining colors and positions of each of the colors inside each dot by computer media,
   forming said dots in one of:
   uniform arrangements, and
   random arrangements,
   dividing a chromatic set of dots into portions of a plurality of dots, and
   forming each of said dots of a color defined by one of:
   an identifiable fixed structure, and a random structure.

8. A method according to claim 7, wherein said chromatic set of dots is divided into portions of four dots.

* * * * *